United States Patent
Reber et al.

(10) Patent No.: US 8,039,389 B2
(45) Date of Patent: Oct. 18, 2011

(54) SEMICONDUCTOR DEVICE HAVING AN ORGANIC ANTI-REFLECTIVE COATING (ARC) AND METHOD THEREFOR

(75) Inventors: Douglas M. Reber, St. Ismier (FR); Mark D. Hall, Austin, TX (US); Kurt H. Junker, Austin, TX (US); Kyle W. Patterson, Froges (FR); Tab Allen Stephens, Austin, TX (US); Edward K. Theiss, Cedar Park, TX (US); Srikanteswara Dakshiina-Murthy, Wappingers Falls, NY (US); Marilyn Irene Wright, Sunnyvale, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 455 days.

(21) Appl. No.: 11/676,100

(22) Filed: Feb. 16, 2007

(65) Prior Publication Data

US 2007/0141770 A1 Jun. 21, 2007

Related U.S. Application Data

(62) Division of application No. 11/100,163, filed on Apr. 6, 2005, now Pat. No. 7,199,429, which is a division of application No. 10/628,668, filed on Jul. 28, 2003, now Pat. No. 6,972,255.

(51) Int. Cl.
*H01L 21/4763* (2006.01)

(52) U.S. Cl. ........ 438/636; 438/671; 438/699; 438/902; 438/952

(58) Field of Classification Search .......... 438/636, 438/669, 671, 902, 952

See application file for complete search history.

(56) References Cited

U.S. PATENT DOCUMENTS

| | | | |
|---|---|---|---|
| 5,324,676 A * | 6/1994 | Guterman | 438/594 |
| 5,536,681 A | 7/1996 | Jang | |
| 5,635,425 A | 6/1997 | Chen | |
| 5,807,660 A | 9/1998 | Lin et al. | |
| 5,880,018 A | 3/1999 | Boeck et al. | |
| 5,976,992 A | 11/1999 | Ui et al. | |
| 5,998,100 A | 12/1999 | Azuma et al. | |
| 6,093,973 A | 7/2000 | Ngo et al. | |

(Continued)

FOREIGN PATENT DOCUMENTS

EP 1154468 A 11/2001

(Continued)

OTHER PUBLICATIONS

Widmann et al; "Technologie hochintegrierter Schaltungen"; 1996 Springer Verlag, pp. 63-64.

(Continued)

*Primary Examiner* — Andy Huynh
(74) *Attorney, Agent, or Firm* — James L. Clingan, Jr.; Daniel D. Hill

(57) ABSTRACT

In a making a semiconductor device, a patterning stack above a conductive material that is to be etched has a patterned photoresist layer that is used to pattern an underlying a tetra-ethyl-ortho-silicate (TEOS) layer. The TEOS layer is deposited at a lower temperature than is conventional. The low temperature TEOS layer is over an organic anti-reflective coating (ARC) that is over the conductive layer. The low temperature TEOS layer provides adhesion between the organic ARC and the photoresist, has low defectivity, operates as a hard mask, and serves as a phase shift layer that helps, in combination with the organic ARC, to reduce undesired reflection.

2 Claims, 2 Drawing Sheets

U.S. PATENT DOCUMENTS

| | | | |
|---|---|---|---|
| 6,143,666 | A | 11/2000 | Lin et al. |
| 6,159,863 | A | 12/2000 | Chen et al. |
| 6,187,687 | B1 | 2/2001 | Plat et al. |
| 6,187,688 | B1 | 2/2001 | Ohkuni et al. |
| 6,197,687 | B1 * | 3/2001 | Buynoski ............ 438/671 |
| 6,211,078 | B1 | 4/2001 | Mathews |
| 6,214,637 | B1 | 4/2001 | Kim et al. |
| 6,306,771 | B1 | 10/2001 | Syau et al. |
| 6,316,167 | B1 | 11/2001 | Angelopoulos et al. |
| 6,417,084 | B1 | 7/2002 | Singh et al. |
| 6,417,167 | B1 | 7/2002 | Kazutoshi |
| 6,420,097 | B1 * | 7/2002 | Pike et al. ............ 430/313 |
| 6,423,384 | B1 | 7/2002 | Khazeni et al. |
| 6,423,385 | B1 | 7/2002 | Kagawa et al. |
| 6,428,894 | B1 | 8/2002 | Babich et al. |
| 6,479,315 | B1 | 11/2002 | Zosel et al. |
| 6,503,818 | B1 | 1/2003 | Jang |
| 6,541,397 | B1 | 4/2003 | Bencher |
| 6,548,423 | B1 | 4/2003 | Plat et al. |
| 6,656,830 | B1 | 12/2003 | Subramanian et al. |
| 6,716,571 | B2 | 4/2004 | Gabriel et al. |
| 6,764,949 | B2 | 7/2004 | Bonser et al. |
| 6,894,342 | B1 | 5/2005 | Hui et al. |
| 6,900,002 | B1 | 5/2005 | Plat et al. |
| 6,972,255 | B2 | 12/2005 | Reber et al. |
| 7,208,423 | B2 | 4/2007 | Hashimoto et al. |
| 2001/0036732 | A1 | 11/2001 | Yoshida et al. |

FOREIGN PATENT DOCUMENTS

| | | |
|---|---|---|
| JP | 2001085407 | 3/2001 |
| JP | 200212972 | 1/2002 |
| JP | 2002530885 | 9/2002 |
| JP | 2002535847 | 10/2002 |
| KR | 20020009109 | 2/2002 |
| WO | 0031782 | 2/2000 |

OTHER PUBLICATIONS

Search report for corresponding EPC Application No. 04778107.5-1235.

U.S. Appl. No. 60/183,507, filed Feb. 17, 2000.

PCT Application PCT/US2004/022434, Search Report and Written Opinion, mailed Jan. 28, 2005.

Office Action mailed Feb. 6, 2006 in U.S. Appl. No. 10/987,790.

Notice of Allowance mailed Sep. 21, 2006 in U.S. Appl. No. 10/987,790.

* cited by examiner

SEMICONDUCTOR DEVICE HAVING AN ORGANIC ANTI-REFLECTIVE COATING (ARC) AND METHOD THEREFOR

FIELD OF THE INVENTION

This invention relates to semiconductor devices, and more particularly, to semiconductor devices that utilize an organic anti-reflective coating (ARC).

RELATED ART

In semiconductor manufacturing there are many layers that require a patterned protective layer for film stack etching. Two known techniques used in such a patterned etch are inorganic anti-reflective coating (ARC) hard masking and spin-on organic bottom anti-reflective coating (BARC). Inorganic ARC hard masking patterning schemes pose difficulties for some applications because the amount of photoresist required to protect the hard mask during the hard mask etch place a lower limit on photoresist thickness. This limit can prevent the use of the thinner photoresist films that give better resolution. Although the spin-on BARC is relatively easier to apply, it is typically so similar to photoresist in its chemical composition and thus etch properties that it also requires a thick photoresist. To circumvent these issues, the use of amorphous carbon thin films has been proposed. Such films have been attempted in semiconductor manufacturing but have been found to have relatively high defect densities of greater than 3.0 defects per square centimeter.

Thus there is a need for an improved mask stack with high resolution and low defectivity.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a patterning stack above a conductive material that is to be etched has a patterned photoresist layer that is used to pattern an underlying a tetraethyl-ortho-silicate (TEOS) layer. The TEOS layer is deposited at a lower temperature than is conventional. The low temperature TEOS layer is over an organic anti-reflective coating (ARC), which is over the conductive layer. The low temperature TEOS layer provides adhesion to both the organic ARC and the photoresist, has low defectivity, operates as a hard mask, and serves as a phase shift layer that helps, in combination with the organic ARC, to reduce undesired reflection. The issue with adhesion has become more difficult with the introduction of photoresists designed for 193 nanometer lithography. The following description provides a more complete explanation of the preferred embodiment of the invention as well as other alternative solutions.

Figure 1:
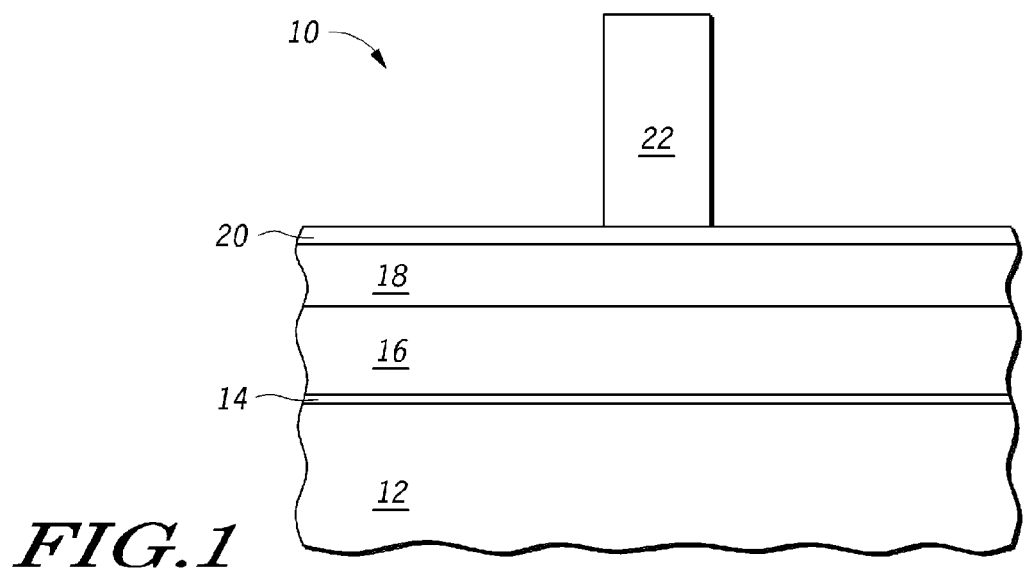
FIG. 1 is a cross section of a semiconductor device according to an embodiment of the invention.

Shown in FIG. 1 is a semiconductor device 10 comprising a semiconductor substrate 12, an insulating layer 14 over substrate 12, a conductive material 16 over insulating layer 14, an organic ARC layer 18 over the conductive material 16, a TEOS layer 20 over organic ARC layer 18, and a patterned photoresist layer 22. In this case patterned photoresist layer 22 is patterned for locating a gate of a MOS transistor. TEOS layer 20 is an oxide layer made using TEOS preferably at a temperature of 300 degrees Celsius. An effective TEOS layer has been deposited using an Applied Materials Centura 5200 DxZ deposition tool using TEOS, oxygen, and helium at 5.5 Torr.

The flow rates are 840 milligrams per minute (mgm) for TEOS, 840 sccm for the oxygen, and 560 sccm for the helium. The power is set at 510 watts for the high frequency and 110 watts for the low frequency. This equipment and these settings are exemplary and could be different. The temperature is intentionally less than the typical deposition temperature of 400 degrees Celsius for TEOS. The temperature is preferably lower than about 350 degrees Celsius. The temperature should also be greater than about 250 degrees Celsius. Other equipment would almost certainly run at somewhat different conditions and such settings would be determined by experimentation. In this example, substrate 12 is silicon, insulating layer 14 is silicon oxide of about 15 Angstroms, conductive material 16 is polysilicon of about 1000 Angstroms, organic ARC 18 is an hydrogenated amorphous carbon film deposited by plasma enhanced chemical vapor deposition (PECVD) as is known to one of ordinary skill in the art and is 500 Angstroms thick, and patterned photoresist 22 is 2500 Angstroms thick. A thinner photoresist at 1500 Angstroms may be preferable. On the other hand, a polysilicon thickness of 1500 Angstroms may be preferable. Also if metal is used instead polysilicon, the thickness is preferably less than 1000 Angstroms.

Figure 2:
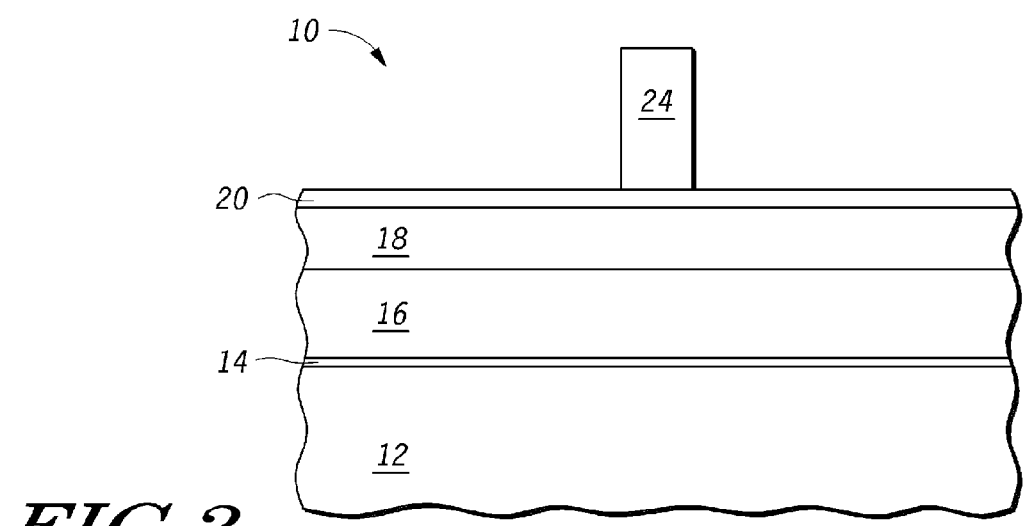
FIG. 2 is a cross section of the semiconductor device of FIG. 1 at a subsequent stage in processing.

Shown in FIG. 2 is semiconductor device 10 after lateral thinning of patterned photoresist 22 to form thinned photoresist 24. This lateral thinning is to reduce the width of the pattern. This is a technique for obtaining smaller geometries than can be exposed by the lithography equipment that is available. In the present case for example, patterned photoresist 22 is achieved by an exposure of 0.1 microns (100 nanometers). After thinning, thinned photoresist is about 50 nanometers in width and reduced in thickness to about 1500 Angstroms. TEOS layer 20 is minimally effected by this thinning process.

Figure 3:
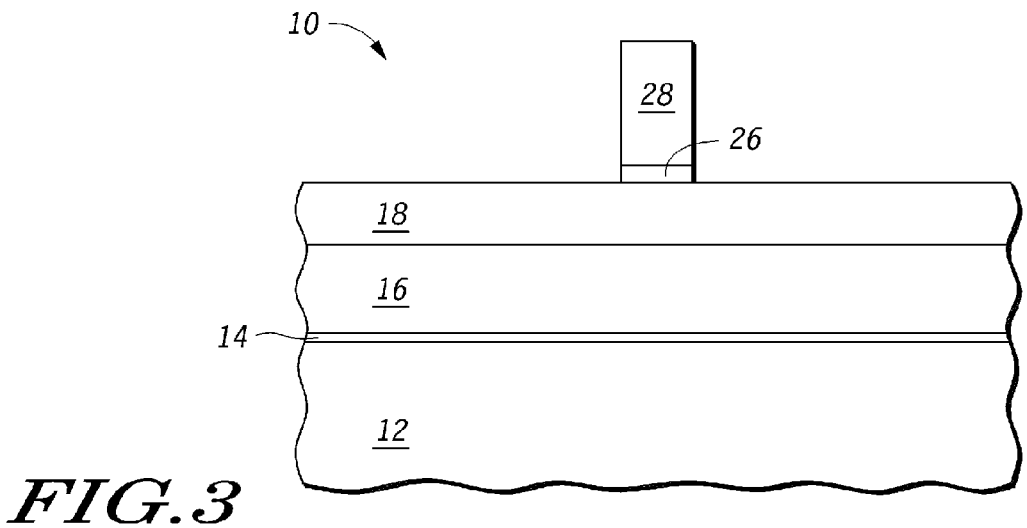
FIG. 3 is a cross section of the semiconductor device of FIG. 2 at a subsequent stage in processing.

Shown in FIG. 3 is semiconductor device 10 after TEOS layer 20 has been etched using thinned photoresist 24 as a mask to form a TEOS portion 26 under thinned photoresist 28.

Figure 4:
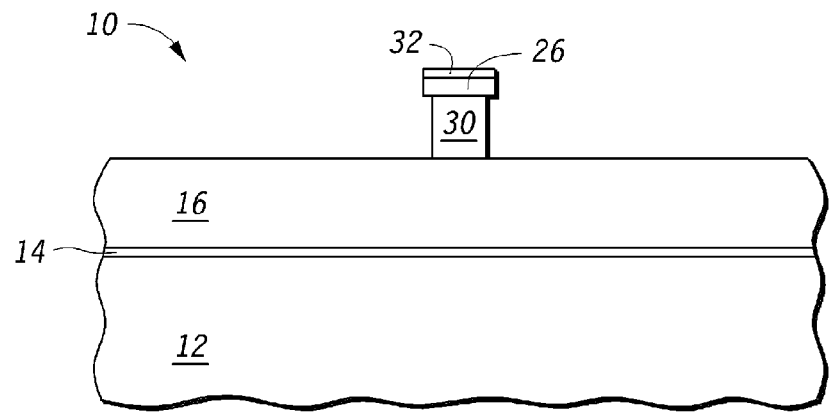
FIG. 4 is a cross section of the semiconductor device of FIG. 3 at a subsequent stage in processing.

Shown in FIG. 4 is semiconductor device 10 after organic ARC layer 18 has been etched using thinned photoresist 28 and TEOS portion 26 to form an ARC portion 30. ARC portion 30 is etched using a reactive ion etch. This etch is an anisotropic etch that becomes isotropic after the exposed portion of ARC 18 is removed. The isotropic effect results in undercutting ARC 18 under TEOS portion 26 to leave ARC portion 30 under TEOS portion 26. This is a technique to further reduce the width of the ultimate layer that is to be formed from conductive layer 16. This technique is known to one of ordinary skill in the art.

Figure 5:
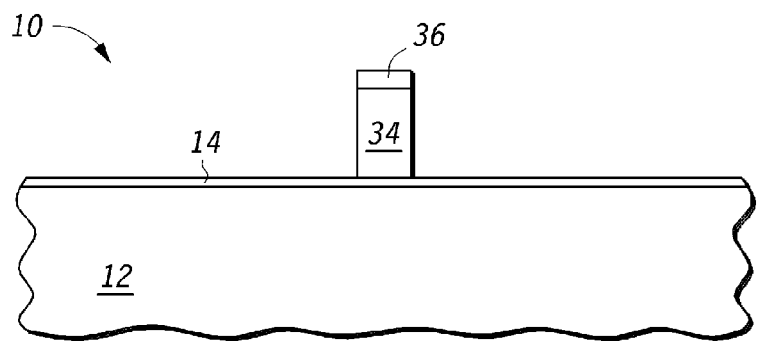
FIG. 5 is a cross section of the semiconductor device of FIG. 4 at a subsequent stage in processing.

Shown in FIG. 5 is a semiconductor device 10 after conductive material 16 is etched using ARC portion 30 as a mask to leave a gate conductor 34 of polysilicon and a ARC portion 36, which is smaller than ARC portion 30 due to the exposure to etchants used to etch conductive layer 16. This gate conductor 34 could be a different material than polysilicon, such as metal. Metals that are being considered include, but are not limited to, tantalum silicon nitride, titanium nitride, and tungsten. Further, metal gates may be combinations of layers and one of those layers may even include polysilicon in addition to one or more metal layers.

Figure 6:
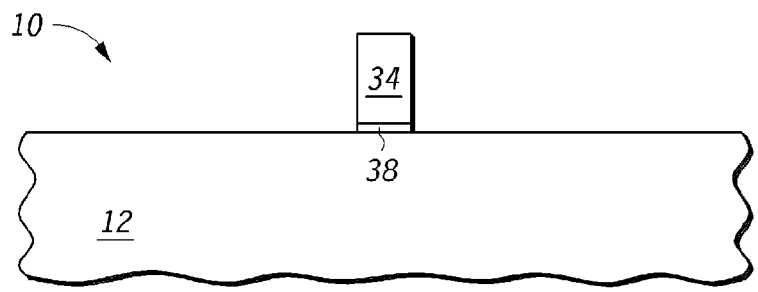
FIG. 6 is a cross section of the semiconductor device of FIG. 5 at a subsequent stage in processing.

Shown in FIG. 6 is a semiconductor device 10 after removal of ARC portion 36 and the portion of insulating layer 14 that is exposed in FIG. 5 to leave a gate dielectric 38 under gate conductor 34. This removal of ARC portion 36 is achieved using conventional processes for removing photoresist. Although there is no photoresist shown in FIG. 5, there may be some remnant of photoresist and etch reactants left that are removed typically by ashing. This ashing is also effective in reacting away the material that is used for organic ARC 18. A combination of wet cleans, such as a piranha and SC1, is also conventional which in combination with the ashing is certain to remove all of the ARC 18 material. Thus, there is no additional removal step required for removing ARC portion 36.

Figure 7:
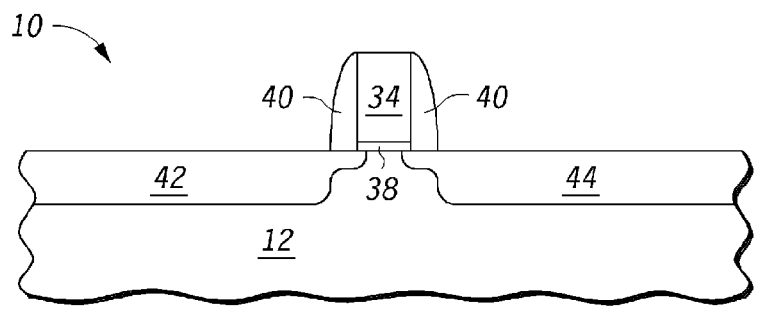
FIG. 7 is a cross section of the semiconductor device of FIG. 6 at a subsequent stage in processing.

Shown in FIG. 7 is a semiconductor device 10 as a completed transistor after sidewall 40 formation and source 42 and drain 44 implants, which is formed in conventional manner after a gate conductor has been formed over a gate dielectric. Thus, this use of low temperature TEOS does not cause any unusual or extra steps in the transistor formation after gate formation.

The use of this low temperature TEOS is beneficial because it essentially eliminates photoresist poisoning that causes photoresist to not develop in areas where it is intended to be removed. The poisoning generally comes from nitrogen in the photoresist that neutralizes the acid in the photoresist. Because the TEOS has no nitrogen, there is no nitrogen to poison the photoresist. Another benefit of low temperature TEOS is that the photoresist adheres well to it. This is contrasted with conventional 400 degree TEOS from which the photoresist does tend to delaminate, especially for photoresists that are designed for 193 nanometer lithography. Also it retains good adherence to the underlying organic ARC layer. Another benefit is that the optical properties of TEOS (n and k at 193 nanometers) provide, in combination with the organic ARC, effective anti-reflection properties. Another benefit is the ease of photolithography rework in the event of improper photoresist patterning in which case the photoresist needs to be removed and re-applied. In such event the TEOS does not need to be removed. Films directly under the photoresist that are etched when photoresist is removed would also have to be removed and re-applied. The TEOS layer does not have to be removed and re-applied in that situation. Further, it protects the organic ARC during the rework process.

An alternative to the above described TEOS solution is to use a organosilane plus an oxidizer to form the layer between ARC 18 and photoresist 22 in the place of TEOS layer 20. The organosilane and oxidizer should be nitrogen-free. TEOS is preferable at least because the chemicals for it are less expensive and tool availability is better. TEOS is also a very stable film. This stability may be difficult to match. A typical organosilane for this purpose is trimethylsilane. A typical oxidizer would be either pure oxygen or carbon dioxide.

Another alternative to the TEOS solution is to use silicon nitride in combination with one of silicon-rich oxynitride (SRON) and silicon-rich oxide (SRO). In one case the combination would be a composite layer that would replace TEOS layer 20. The silicon nitride layer would be on the organic ARC 16 and the SRON or SRO layer would be between the photoresist and the silicon nitride layer. This is effective in providing both the necessary adhesion and the low defectivity. In another case the combination would be separated by the organic ARC. The silicon nitride layer would be between the conductive layer 16 and the ARC layer 18. The SRON or SRO layer would be between the ARC layer 18 and the photoresist. This is also effective in providing adequate adhesion and defectivity. These two alternatives using SRO or SRON in combination with silicon nitride are both more complicated than the TEOS solution and provide a more difficult integration with preferred processes.

In the foregoing specification, the invention has been described with reference to specific embodiments. However, one of ordinary skill in the art appreciates that various modifications and changes can be made without departing from the scope of the present invention as set forth in the claims below. For example, the organic ARC may not have to be amorphous. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a transistor, comprising:

providing a semiconductor substrate;

forming an insulating layer over the semiconductor substrate, wherein the insulating layer is for use as a gate dielectric;

forming a conductive layer over the insulating layer;

forming an organic anti-reflective coating (ARC) layer over the conductive layer;

depositing a silicon oxide cap layer using a organosilane based precursor over the organic ARC layer;

depositing a photoresist layer over the silicon oxide cap layer;

patterning the photoresist layer to form a patterned photoresist structure;

after the patterning, etching the silicon oxide cap and the organic ARC layer using the patterned photoresist structure as a mask;

thinning the ARC layer to form a thinned organic ARC layer etching the conductive using the thinned organic ARC layer as a mask to form a gate from the conductive layer; and forming a source and a drain in the semiconductor substrate, wherein the source is on a first side of the gate and the drain is on a second side of the gate.

2. The method of claim 1 further comprising thinning the patterned photoresist.

* * * * *